(12) United States Patent
Reid (10) Patent No.: US 6,589,354 B2
(45) Date of Patent: Jul. 8, 2003

(54) METHOD AND APPARATUS FOR IN-SITU LITHOGRAPHY MASK CLEANING

(76) Inventor: Paul B. Reid, 66 Big Oak Rd., Stamford, CT (US) 06903

(*) Notice: Subject to any disclaimer, the term of this patent is extended or adjusted under 35 U.S.C. 154(b) by 157 days.

(21) Appl. No.: 09/753,665

(22) Filed: Jan. 4, 2001

(65) Prior Publication Data

US 2002/0083957 A1 Jul. 4, 2002

(51) Int. Cl.⁷ ................................................ B06B 7/04
(52) U.S. Cl. ............................... 134/1; 134/21; 134/34; 134/37; 15/345
(58) Field of Search ..................... 134/1, 37, 1.3, 134/21, 34, 902; 15/345; 34/250, 251, 245, 275, 276, 259, 264, 380, 443

(56) References Cited

U.S. PATENT DOCUMENTS

| | | | |
|---|---|---|---|
| 4,837,447 A | 6/1989 | Pierce et al. | |
| 5,559,584 A | 9/1996 | Miyaji et al. | |
| 6,055,742 A | 5/2000 | Kim | |
| 6,288,769 B1 * | 9/2001 | Akagawa et al. | 355/30 |
| 6,305,097 B1 | 10/2001 | Salamati-Saradh et al. | |
| 6,394,109 B1 * | 5/2002 | Somekh | 134/1 |
| 6,395,102 B1 * | 5/2002 | Salamati-Saradh et al. | 134/1 |

FOREIGN PATENT DOCUMENTS

| | | |
|---|---|---|
| JP | 58-21742 | 2/1983 |
| JP | 61-10237 | 1/1986 |
| JP | 3-155550 | 7/1991 |
| JP | 8-78182 | 3/1996 |
| JP | 8-124822 | 5/1996 |

OTHER PUBLICATIONS

Abstract of JP 8–124822, Patent Abstracts of Japan, vol. 1996, No. 09, Sep. 30, 1996.
Abstract of JP 3–155550, Patent Abstracts of Japan, vol. 015, No. 391, Oct. 3, 1991.
Abstract of JP 58–021742, Patent Abstracts of Japan, vol. 007, No. 096, Apr. 22, 1983.
Abstract of JP 61–010,237, Patent Abstracts of Japan, vol. 010, No. 150, May 31, 1986.
Abstract of JP 8–078182, Patent Abstracts of Japan, vol. 1996, No. 07, Jul 31, 1996.
Copy of International Search Report for Appl. No. PCT/US02/00098, dated Jun. 11, 2002, 7 pages.

* cited by examiner

Primary Examiner—Alexander Markoff
(74) Attorney, Agent, or Firm—Sterne, Kessler, Goldstein & Fox, P.L.L.C.

(57) ABSTRACT

A method and system for in-situ cleaning of a reticle. Ionized gas is directed onto the reticle by a delivery device. The ionized gas neutralizes electro-static attraction between the reticle and particulate contaminants on the reticle and thereby dislodges them from the reticle. The ionized gas and particulate contaminants are then removed from the reticle by a vacuuming pump and transported from the system by a contaminant collector. As a result of the in-situ cleaning method and system, the overall risk of chip defects due to reticle particulate contaminants is reduced, and chip and wafer yield is improved.

27 Claims, 5 Drawing Sheets

METHOD AND APPARATUS FOR IN-SITU LITHOGRAPHY MASK CLEANING

BACKGROUND OF THE INVENTION

1. Field of the Invention

The present invention relates generally to lithography systems. More particularly, this invention relates to cleaning a reticle during use in a lithography system.

2. Related Art

Lithography is a process used to create features on the surface of substrates. Such substrates can include those used in the manufacture of flat panel displays, circuit boards, various integrated circuits, and the like. A frequently used substrate for such applications is a semiconductor wafer. While this description is written in terms of a semiconductor wafer for illustrative purposes, one skilled in the art would recognize that this description also applies to other types of substrates known to those skilled in the art.

During lithography, a wafer, which is disposed on a wafer stage, is exposed to an image projected onto the surface of the wafer by an exposure system located within a lithography system. The exposure system includes a reticle (also called a mask) for projecting an image onto the wafer. The exposure system also includes an illumination system, a projection optics system, and a wafer alignment stage.

Particulate contamination on the reticle can be imaged on each pattern on the wafer. As the particle is not part of the desired pattern, the reticle image produced contains a defect (the image of the particle). In many cases, this defect can cause the functional failure of every pattern on every wafer printed with the contaminated reticle. As shorter and shorter wavelengths are employed to improve the lithography process and improve the capability to print finer features, the system becomes more sensitive to smaller particles. These are more difficult (or currently impossible) to detect on the reticle prior to its installation in the lithography tool. In addition, it is more difficult (if not impossible) to maintain the reticle environment clean enough to prevent the deposition of such small particles on the reticle.

While exposure optics are used in the case of photolithography, a different type of exposure apparatus can be used depending on the particular application. For example, x-ray, ion, electron, or photon lithographies each can require a different exposure apparatus, as is known to those skilled in the art. The particular example of photolithography is discussed here for illustrative purposes only.

The projected image produces changes in the characteristics of a layer, for example photoresist, deposited on the surface of the wafer. These changes correspond to the image features projected onto the wafer during exposure. Subsequent to exposure, the layer can be etched to produce a patterned layer. The pattern corresponds to those image features projected onto the wafer during exposure. This patterned layer is then used to remove or further process exposed portions of underlying structural layers within the wafer, such as conductive, semiconductive, or insulative layers. This process is then repeated, together with other steps, until the desired features have been formed on the surface, or in various layers, of the wafer.

Step-and-scan technology works in conjunction with a projection optics system that has a narrow, typically rectangular imaging slot called the exposure field. Rather than expose the entire wafer at one time, individual fields are scanned onto the wafer one at a time. This is done by moving the wafer and reticle simultaneously such that the imaging slot is moved across the field during the scan. The wafer stage must then be asynchronously stepped between field exposures to allow multiple copies of the reticle pattern to be exposed over the wafer surface. In this manner, the quality of the image projected onto the wafer is maximized. While using a step-and-scan technique generally assists in improving overall image quality, image distortions generally occur in such systems due to imperfections within the projection optics system, illumination system, and the particular reticle being used. An exemplary step-and-scan lithography system is the Microscan II, manufactured by Silicon Valley Group, Inc., San Jose, Calif.

The illumination system of a lithographic system includes a light source. Excimer lasers are one such light source and operate at several characteristic wavelengths ranging from vacuum ultraviolet light to greater than 400 nanometers (nm) depending on the gas mixture used. By shortening the wavelength of the light, the resolution of the projection system is improved. Thus, in a lithography system, it is desirable to utilize a light source with wavelengths within the vacuum ultraviolet range, i.e., below 200 nm.

As shorter wavelength light sources are used in lithography, organic contamination in the exposure area of the lithography system becomes a greater problem. It is well known that organic contaminates have high optical absorption coefficients at shorter wavelengths, particularly at 157 nm and below. A 1 nm film of organic contaminant belonging to the alkane group will drop the optical transmission at 157 nm by 1%. Further, an acetone residue left on the surface of a calcium fluoride optical element reduces the transmission by 4% at 157 nm. (See, T. M. Bloomstein et al., Optical Materials and Coatings at 157 nm, 3676 S.P.I.E. Proceedings 342–9 (1999); which is incorporated herein by reference). Optical intensity is an important issue as the number of optical elements increases in a lithography system. It is for this reason that organic contamination can be detrimental to optical elements in 157 nm and below lithography systems.

Sources of organic contamination within a lithography system include out-gassed products from polymer materials and solvents used for degreasing tool parts, for example. Extremely low levels of organic contamination are critical for the exposure path in the lithography system, and an active purge system and strict material selection are required for those areas of the system associated with this path.

Therefore, what is needed is a technique of removing particle contamination of the mask over an extended period of time.

SUMMARY OF THE INVENTION

The present invention makes practical maintaining near zero particle contamination of the mask over an extended period of time by repetitive cleaning of the mask during the actual exposure process. The repeated cleaning shortens the effective amount of time that the mask is exposed to contamination, making realistic levels of environmental control (Class 1 to Class 10) consistent with a near zero particulate requirement.

The present invention utilizes a cleaning system in which the reticle is passed underneath a delivery device using a step and scan method. In one embodiment, the delivery device remains stationary. The delivery device transports a gas, which becomes ionized before being directed onto the mask surface of the reticle. The ionized gas neutralizes electro-static attraction between the mask and particulates, thereby "blowing off" the particulates. The ionized gas and particulates are then transported away from the mask surface of the reticle by a contaminant collector. A positive or negative charge can be applied to the contaminant collector to better promote collection of particulate contamination from the mask.

Further features and advantages of the present invention, as well as the structure and operation of various embodiments of the present invention, are described in detail below with reference to the accompanying drawings.0

BRIEF DESCRIPTION OF THE FIGURES

The accompanying drawings, which are incorporated herein and form part of the specification, illustrate the present invention and together with the description further serve to explain the principles of the invention and to enable a person skilled in the pertinent art to make and use the invention.

DETAILED DESCRIPTION OF THE PREFERRED EMBODIMENTS

An example embodiment of the present invention is now described with reference to the figures where like reference numbers indicate identical or functionally similar elements. The left most digit of each reference number corresponds to the figure in which the reference number is first used. While specific configurations and arrangements are discussed, it should be understood that this is done for illustrative purposes only. A person skilled in the relevant art will recognize that other configurations and arrangements can be used without departing from the spirit and scope of the invention. It will be apparent to a person skilled in the relevant art that this invention can also be employed in a variety of other applications.

Figure 1:
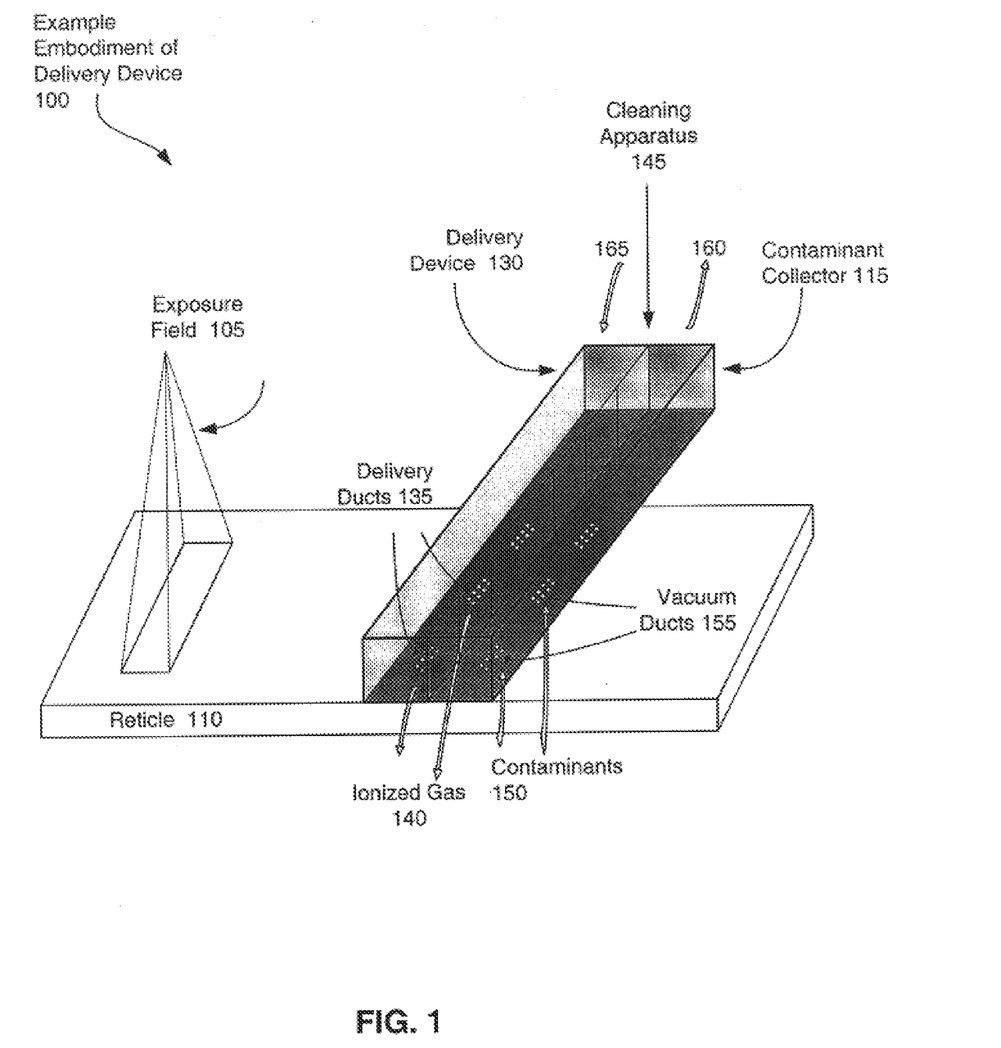
FIG. 1 is a diagram of an example embodiment of the cleaning apparatus of the present invention.

FIG. 1 is a diagram of an example embodiment of the cleaning apparatus of the present invention. Reticle 110 is translated within an imaging station (not shown), where in-situ cleaning occurs. An exposure field for lithography is shown at 105. The exposure field 105, which is produced by the illumination system, is stationary. As described above, to expose portions of a wafer (not shown), the reticle 110 is translated in two dimensions to step and scan across the exposure field 105, as would be apparent to a person skilled in the relevant art. According to the present invention, a cleaning apparatus 145 is positioned in close proximity to the mask surface of the reticle 110. By the term "close proximity", the inventors mean that those skilled in the art can, without undue experimentation, determine just how close the cleaning apparatus 145 is to the reticle 110 based on empirical data and other variables, such as the volume of gas flow, amount of contamination, size of the contaminants, physical characteristics of the cleaning apparatus 145, and the like. The cleaning apparatus 145 comprises a delivery device 130 and a contaminant collector 115.

As the reticle 110 is stepped and scanned to expose the wafer (not shown), the reticle 110 passes repeatedly underneath the cleaning apparatus 145. The exposure field 105 and the cleaning apparatus 145 remain stationary. The delivery device 130 directs the ionized gas 140 onto the mask surface of the reticle 110. The ionized gas 140 reduces electro-static attraction between the mask (i.e., top) surface of the reticle 110 and particulate contamination lodged thereon (not shown). The ionized gas 140 is used to dislodge particulate contamination from the mask surface of the reticle 110. As a result, particulate contamination of the reticle 110 is reduced to an acceptable level.

The gas is preferably nitrogen that is ionized to produce a stream of $N_2$ anions and electrons. Other gases can be used. "Off-the-shelf" devices that produce such an ion stream are commercially available (e.g., NRD Inc., Grand Island, N.Y.,—Nuclecel™, model 2021CR).

Alternatively, the ionized gas 140 can be produced by bombarding or otherwise exposing a gas with alpha particles produced by a radioactive isotope. The radioactive isotope can be located within the cleaning apparatus 145, or the gas can be exposed to the radioactive isotope upstream (e.g., closer to the gas source (not shown)). For example, Polonium with an atomic weight of 210 produces alpha particles. The radioactive isotope Americium also produces alpha particles. In yet another embodiment, the ionized gas 140 can be produced by electrostatically charging a gas, using techniques that would become apparent to a person skilled in the relevant art.

The delivery device 130 carries the ionized gas via an internal cavity. The delivery device 130 contains delivery ducts 135. The delivery ducts 135 are holes, slots, slits, or jets used to direct the ionized gas 140 onto the mask surface of the reticle 110. The size, shape, number and location of the holes, slots, slits, or jets used to deliver the ionized gas 140 will be determined by implementation requirements.

The contaminant collector 115 vacuums the ionized gas 140 from the mask surface of the reticle 110 after the ionized gas 140 is directed onto the mask surface of the reticle 110 to dislodge particulate contaminants from the mask surface of the reticle 110. The contaminant collector 115 contains vacuum ducts 140. The vacuum ducts 155 are holes, slots, slits, or jets used to remove particulate contaminants 150 and the ionized gas 140 from the reticle 110. The size, shape, number and location of the holes, slots, slits, or jets used to vacuum the particulate contaminants 150 and the ionized gas 140 will be determined by implementation requirements.

Particulate contaminants 150 and ionized gas 140 are vacuumed through the vacuum ducts 155 and are removed from the mask surface of the reticle 110 by the contaminant collector 115. The vacuum ducts 155 can be positively or negatively electrically biased to provide additional attraction of contaminants dislodged from the mask surface of the reticle. The size, shape, number and location of the vacuum ducts 155 will be determined by implementation requirements. In a further embodiment, the position of the delivery device 130 and the contaminant collector 115 can be reversed.

Figure 2:
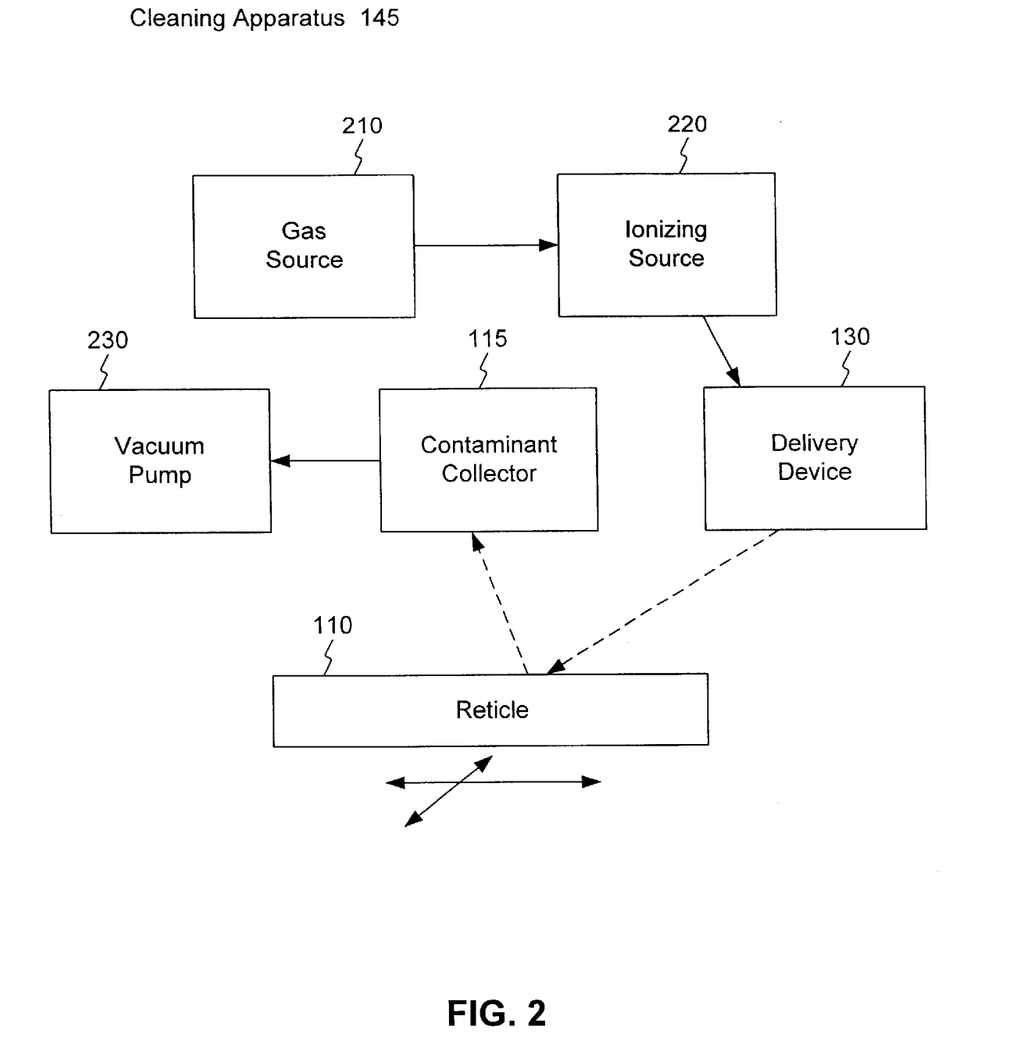
FIG. 2 is a block diagram of the cleaning apparatus of the present invention.

FIG. 2 is a generalized block diagram of the cleaning apparatus of the present invention. Gas source 210 supplies a gas, such as nitrogen. An ionizing source 220 is used to ionize the gas provided by gas source 210. As noted above, the gas can be bombarded with alpha particles or electrostatically ionized by the ionizing source 220. The ionized gas 140 is then provided to the delivery device 130, which directs the ionized gas 140 onto the reticle 110. After the ionized gas 140 dislodges contaminants from the reticle 110, the ionized gas 140 and the contaminants 150 are vacuumed by vacuum pump 230, via contaminant collector 115.

Figure 3:
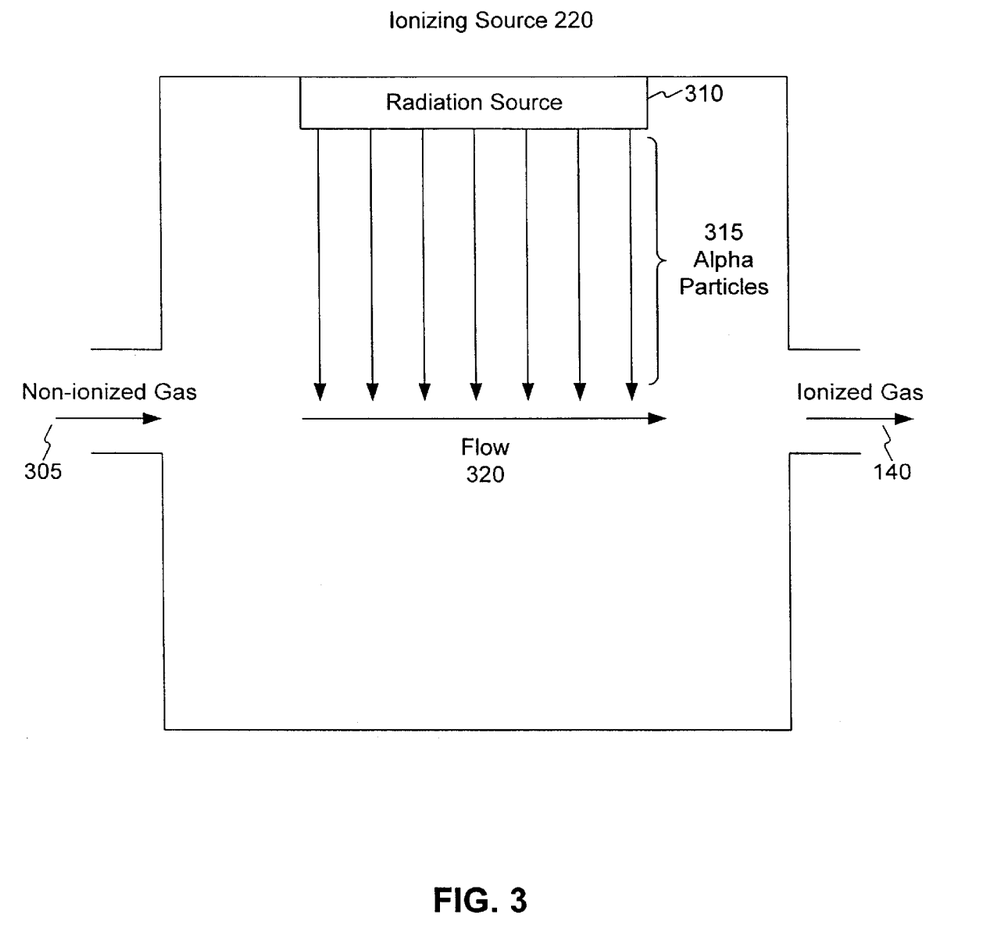
FIG. 3 is a schematic diagram of a delivery device contained in the system of the present invention.

FIG. 3 is a schematic diagram of an alpha particle ionizing source 220, according to the present invention. Non-ionized gas 305 enters a chamber having a radiation source 310, which produces alpha particles 315. The alpha particles 315 bombard the gas (as illustrated generally at flow 320) to produce the ionized gas 140, which then exits and is directed onto the reticle 110. As discussed above, in one embodiment, the ionizing source 310 is a radioactive isotope such as Polonium or Americium. In an alternative embodiment, the radiation source 310 can be replaced by an electrostatic device used to ionize the gas.

Figure 4:
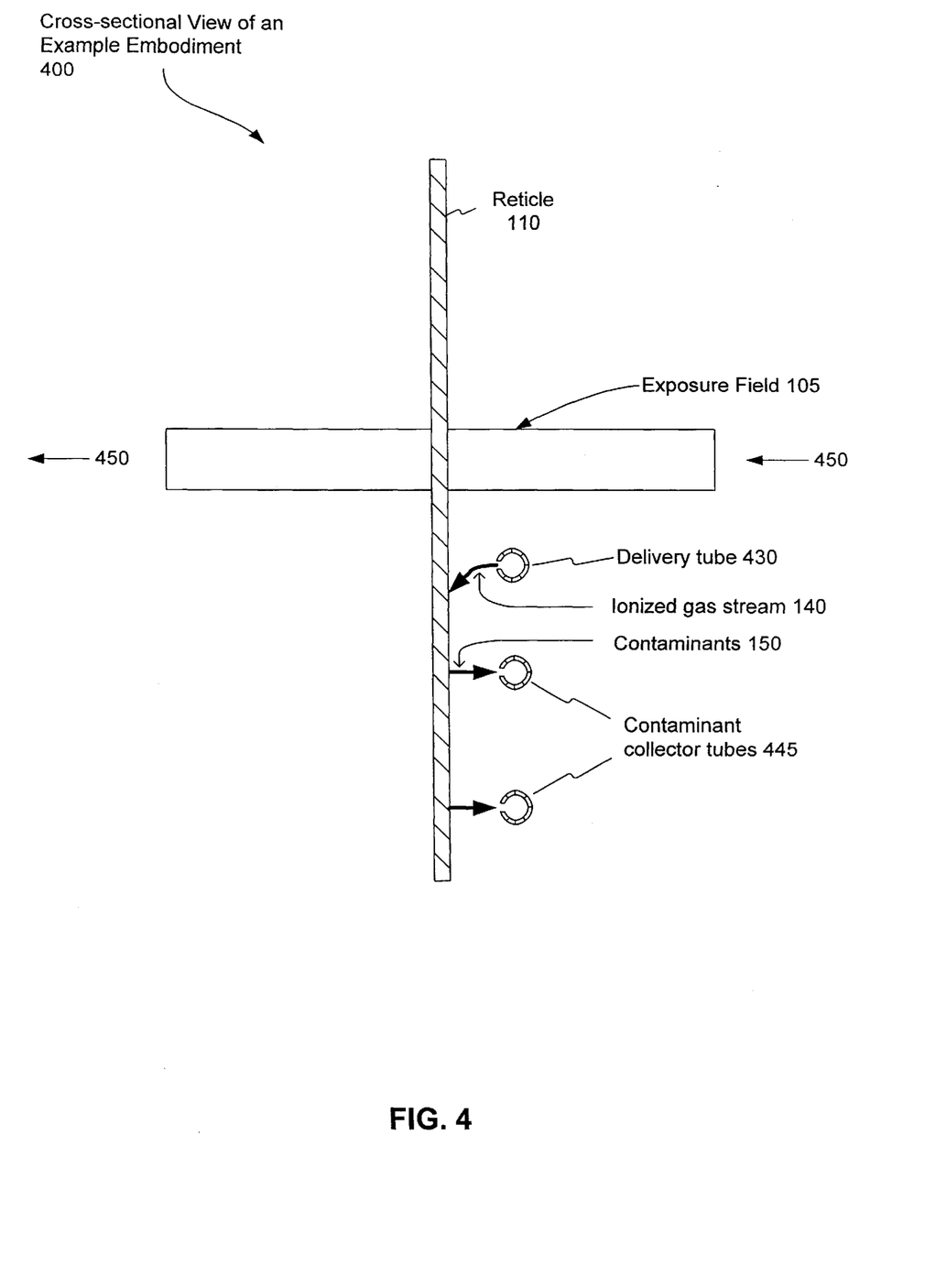
FIG. 4 is a cross-sectional view of an example embodiment of the present invention.

FIG. 4 is a cross-sectional view of an example embodiment of the present invention. The reticle 110 is shown in cross section and is moved across the exposure field 105 in a step and scan fashion. The light corresponding to the exposure field 105 travels from right to left in this figure and passes through the transmissive reticle, as illustrated by the arrows. (Of course, the present invention can also be adapted for lithography systems implementing a reflective reticle.) In this example embodiment, a single delivery tube 430 directs the ionized gas stream 140 onto the reticle 110. Plural delivery tubes, including tubes on both sides of the exposure field, can be used. Particulate contaminants 150 are dislodged from the mask surface by the ionized gas stream 140 and removed via vacuum by contaminant collector tubes 445. A single collector tube can be used. The delivery tube and collector tubes can have cylindrical, elliptical, rectangular, or the like, cross section.

Figure 5:
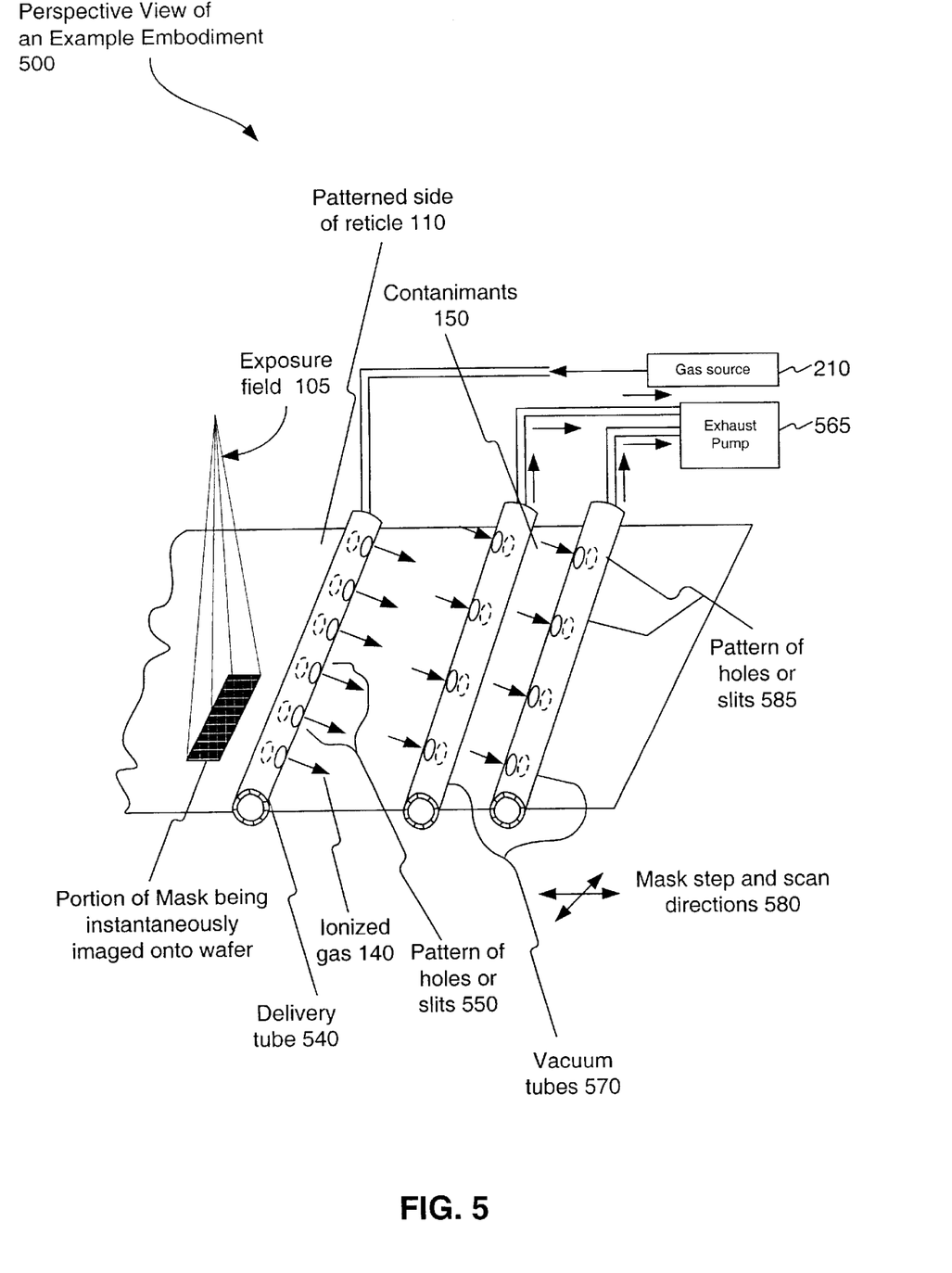
FIG. 5 is a perspective view of an example embodiment of the present invention.

FIG. 5 is a perspective view of an example embodiment of the present invention. The reticle 110 is shown with its patterned side facing upward. The reticle 110 is moved underneath the exposure field 105 in step and scan directions 580, as a portion of the mask is imaged onto the wafer (not shown). Gas source 210 supplies non-ionized gas to delivery tube 540. Ionizing source 220 is not shown in this figure. However, in yet another embodiment, a radiation source can be located within delivery tube 540, or located in the supply tubing between the gas source 210 and the delivery tube 540. The alpha particle source can be Americium, Polonium, or any other radioactive isotope known to one skilled in the art to produce alpha particles, and can be adhesively affixed. The Delivery tube 540 contains a pattern of holes, slots, slits, or jets 550 and, in said yet another embodiment, an internal alpha particle source. The size, shape, number and location of the holes, slots, slits, or jets 550 used to deliver the ionized gas 140 will be determined by implementation requirements.

For example, in one embodiment, holes, slots, slits, or jets 550 can be located directly underneath the delivery tube 540. Example embodiment 500 can also contain a plurality of delivery tube 540. Delivery tube 540 directs the ionized gas 140 onto the reticle 110. The ionized gas 140 dislodges particulate contamination.

The vacuum tubes 570 contain a pattern of holes, slots, slits, or jets 585. The size, shape, number and location of the holes, slots, slits, or jets 585 used to deliver the ionized gas 140 will be determined by implementation requirements. For example, in one embodiment, holes, slots, slits, or jets 585 can be located directly underneath the vacuum tubes 570. Example embodiment 500 can also contain only one of vacuum tubes 570. Vacuum tubes 570 vacuum the particulate contaminants 150 from the patterned side of the reticle 110 and transport the particulate contaminants 150 to an exhaust pump 565, where they are eventually filtered, or otherwise removed/discarded. In a further embodiment, the position of the delivery tube 540 and the vacuum tubes 570 can be reversed.

In yet a further embodiment, automated cleaning can be performed by computer control to vary the amount of cleaning. For example, the gas flow can be adjusted based on system variables, such as the level of contamination (perhaps determined by sampling the gas prior to the exhaust pump), temperature, pressure, or the like variables.

Conclusion

Thus, according to the present invention particulate contaminants are continuously being removed from the reticle 110 in-situ during lithography. Alternatively, the above described cleaning can be done before, during and/or after imaging is being performed.

While various embodiments of the present invention have been described above, it should be understood that they have been presented by way of example, and not limitation. It will be apparent to persons skilled in the relevant art(s) that various changes in form and detail can be made therein without departing from the spirit and scope of the invention. Thus, the present invention should not be limited by any of the above-described exemplary embodiments, but should be defined only in accordance with the following claims and their equivalents.

What is claimed is:

1. A method of in-situ cleaning a reticle during lithography, comprising the steps of:
    (a) translating the reticle during lithography;
    (b) exposing a first portion of a mask surface of the translated reticle; and
    (c) cleaning a second portion of the mask surface of the translated reticle;
        wherein the first portion and the second portion of the mask surface of the reticle are different.

2. The method of claim 1, wherein said cleaning step comprises;
    directing an ionized gas onto the second portion of the mask surface of the reticle; and
    vacuuming the ionized gas from the second portion of the mask surface of the reticle;
    whereby contaminants are removed from the second portion of the mask surface of the reticle.

3. The method of claim 2, wherein said directing and vacuuming steps are performed in close proximity to the mask surface of the reticle.

4. The method of claim 2, wherein the ionized gas is produced by exposing a gas with alpha particles.

5. The method of claim 2, wherein the ionized gas is produced by electrostatically charging a gas.

6. The method of claim 4, wherein the gas is nitrogen.

7. The method of claim 4, further comprising the step of using a radioactive isotope to produce the alpha particles.

8. The method of claim 4, further comprising the step of using a Polonium source to produce the alpha particles.

9. The method of claim 4, further comprising the step of using an Americium source to produce the alpha particles.

10. The method of claim 3, wherein said directing step comprises directing ionized nitrogen gas.

11. The method of claim 5, wherein the gas is nitrogen.

12. A method of in-situ cleaning a reticle during lithography, comprising the steps of:
    (a) placing a source of alpha particles in a delivery device;
    (b) directing nitrogen gas through the delivery device and toward an unexposed portion of a mask surface of the reticle during lithography, the nitrogen gas becoming ionized when interacting with the alpha particles to dislodge contaminants from the unexposed portion of the mask surface of the reticle; and (c) vacuuming the contaminants from the unexposed portion of the mask surface of the reticle.

13. An apparatus for in-situ cleaning a reticle of a lithography system, comprising:

a reticle translation system that translates the reticle during lithography;

an exposure system that exposes a first portion of a mask surface of the translated reticle; and a cleaning system that cleans a second portion of the mask surface of the translated reticle;

wherein said reticle translation system, said exposure system, and said cleaning system are disposed such that they contemporaneously operate on the reticle; and wherein said first and said second portion of the mask surface are different.

14. The apparatus of claim 13, wherein said cleaning system comprises:

(a) a gas source to output a gas;

(b) an ionizing source coupled to said gas source to ionize the gas;

(c) a delivery device, coupled at least one of said gas source and said ionizing source, to direct the ionized gas onto a mask surface of the reticle to dislodge contaminants from the mask surface of the reticle during lithography; and (d) a contaminant collector to remove the contaminants.

15. The apparatus of claim 14, wherein the gas is nitrogen.

16. The apparatus of claim 14, wherein said ionizing source produces alpha particles.

17. The apparatus of claim 16, wherein said alpha particles are produced by a radioactive isotope.

18. The apparatus of claim 16, wherein said alpha particles are produced by Polonium.

19. The apparatus of claim 16, wherein said alpha particles are produced by Americium.

20. The apparatus of claim 14, wherein said gas is ionized using electrostatic charges.

21. The apparatus of claim 16, wherein said ionizing source is in said delivery device.

22. The apparatus of claim 16, wherein said delivery device and said contaminant collector include tubes, having openings on a side adjacent a mask surface of the reticle.

23. The apparatus of claim 14, wherein said contaminant collector is positively or negatively electrically biased to induce electrostatic attraction of contaminants dislodged from the mask surface of the reticle.

24. The apparatus of claim 16, wherein said delivery device and said contaminant collector are implemented by a bi-chambered device, a first chamber of said bi-chambered device being used as said delivery device, and a second chamber of said bi-chambered device being used as said contaminant collector.

25. The apparatus of claim 13, wherein said cleaning system is in close proximity to the mask surface of the reticle.

26. An apparatus for in-situ cleaning of a reticle of a lithography system comprising:

a means for translating a reticle during lithography;

a means for exposing a first portion of a mask surface of the reticle during lithography; and a means for cleaning a second portion of the mask surface of the reticle during lithography;

wherein said translating, exposing, and cleaning means operate contemporaneously on the reticle; and wherein said first and said second portion of the mask surface are different.

27. The apparatus of claim 26, wherein said means for cleaning said second portion of the mask surface of the reticle further comprises:

a means for ionizing a gas;

a means for directing the ionized gas onto the second portion of the mask surface of the reticle; and a means for collecting the ionized gas and dislodged contaminants from the second portion of the mask surface of the reticle.

\* \* \* \* \*

UNITED STATES PATENT AND TRADEMARK OFFICE
CERTIFICATE OF CORRECTION

PATENT NO. : 6,589,354 B2
DATED : July 8, 2003
INVENTOR(S) : Paul B. Reid

It is certified that error appears in the above-identified patent and that said Letters Patent is hereby corrected as shown below:

Drawings,
Sheet 5, Figure 5, reference numeral 150, please delete the word "Contanimants" and replace it with -- Contaminants --.
Please delete Sheets 1-5 and insert the formal drawings appearing on the following additional sheets.

Column 3,
Line 10, please delete "0" from the end of the paragraph.

Column 5,
Line 8, please delete "ionizing source 310" and insert therefore -- radiation source 310 --.
Line 42, please delete "Delivery" and insert therefor -- delivery --.

Column 7,
Line 26, please delete "a mask surface" and insert therefore -- the mask surface --.

Column 8,
Lines 3 and 10, please delete "16," and insert therefore -- 14, --.
Line 5, please delete "a mask surface" and insert therefore -- the mask surface --.

Signed and Sealed this

Fifteenth Day of March, 2005

JON W. DUDAS
*Director of the United States Patent and Trademark Office*